United States Patent
Chalupka et al.

(10) Patent No.: US 6,472,673 B1
(45) Date of Patent: Oct. 29, 2002

(54) LITHOGRAPHIC METHOD FOR PRODUCING AN EXPOSURE PATTERN ON A SUBSTRATE

(75) Inventors: Alfred Chalupka, Vienna (AT); Ernst Haugeneder, Vienna (AT)

(73) Assignee: IMS Ionen-Mikrofabrikations Systeme GmbH, Vienna (AT)

( * ) Notice: Subject to any disclaimer, the term of this patent is extended or adjusted under 35 U.S.C. 154(b) by 0 days.

(21) Appl. No.: 09/363,019

(22) Filed: Jul. 29, 1999

(51) Int. Cl.$^7$ ............................................. H01J 37/304

(52) U.S. Cl. ................................. 250/492.22; 250/398

(58) Field of Search .................. 250/492.2, 492.22, 250/398

(56) References Cited

U.S. PATENT DOCUMENTS

| | | | | |
|---|---|---|---|---|
| 4,757,208 A | * | 7/1988 | McKenna et al. | 250/492.2 |
| 4,985,634 A | * | 1/1991 | Stengl et al. | 250/492.2 |
| 5,214,291 A | * | 5/1993 | Hirai et al. | 250/492.2 |
| 5,742,062 A | * | 4/1998 | Stengl et al. | 250/396 R |
| 5,874,198 A | * | 2/1999 | Okino | 430/296 |
| 5,973,332 A | * | 10/1999 | Muraki et al. | 250/492.2 |
| 6,252,344 B1 | * | 6/2001 | Ooae et al. | 313/413 |
| 6,320,195 B1 | * | 11/2001 | Magome | 250/442.11 |
| 6,323,500 B1 | * | 11/2001 | Yamashita | 250/492.23 |

OTHER PUBLICATIONS

U. Behringer and H. Engelke, "Intelligent Design Splitting in the Stencil Mask Technology Used for Electron–and Ion–Beam Lithography," J. Vac. Sci. Technol. B11(6), pp. 2400–2403, Nov./Dec. 1993.

J. Frosien et al., "Application of the Electron Microprojector in the Field of Microlithography," Proceedings of the Microcircuit Engineering '79, Rhienisch–Westfalische Technische Hochschule, Aachen, Germany, Sep. 25–27, 1979.

J. Butschke et al., "PN and SOI Wafer Flow Process for Stencil Mask Fabrication," Mask technology for integrated circuits and micro–components lectures '98, GMM Conference, Munich, Germany (GMM Fachbericht; 25), VDE–Verlag, pp. 29–38, Nov. 16–17, 1998.

H. Koops, "Electron Beam Projection Techniques," Fine Line Lithography, Ed. R. Newman, North–Holland, Ch. 3, pp. 235–255, 1980.

Gerhard Gross et al., "Ion Projection Lithography: Status of the MEDEA Project and United States/European Cooperation," J. Vac. Sci. Technol. B16(6), pp. 3150–3153, Nov./Dec. 1998.

J. Brugger et al., "Resistless 100–nm Pattern Formation Using Nanosieves as Shadow Masks," Proceedings of the Conference on Micro–and Nano–Engineering, Rome, Italy, Sep. 1999.

* cited by examiner

Primary Examiner—Kiet T. Nguyen
(74) Attorney, Agent, or Firm—Finnegan, Henderson, Farabow, Garrett & Dunner, LLP

(57) ABSTRACT

For producing an exposure pattern on a resist material layer on a substrate, a mask having a pattern of transparent structures is illuminated with a beam of energetic radiation and the structure pattern is imaged onto the substrate by means of the structured beam within a pattern transfer system such as an ion-beam lithography system. The pattern image produced on the substrate is shifted laterally with respect to the substrate between a plurality of predetermined shift positions and with each shift position the substrate is irradiated for a predetermined time, wherein the width of lateral displacements is smaller than the minimum feature size of the exposure pattern, the blur as determined by the pattern transfer system is not smaller than the width of lateral displacements, and the dimension and/or direction of the structure patterns are incongruent with respect to the lateral displacements. Thus on the substrate, the exposures superpose into a spatial distribution of exposure dose which exceeds the specific minimum exposure dose of the resist material only within the desired regions of the exposure pattern.

13 Claims, 8 Drawing Sheets

Fig. 1 (state of the art)

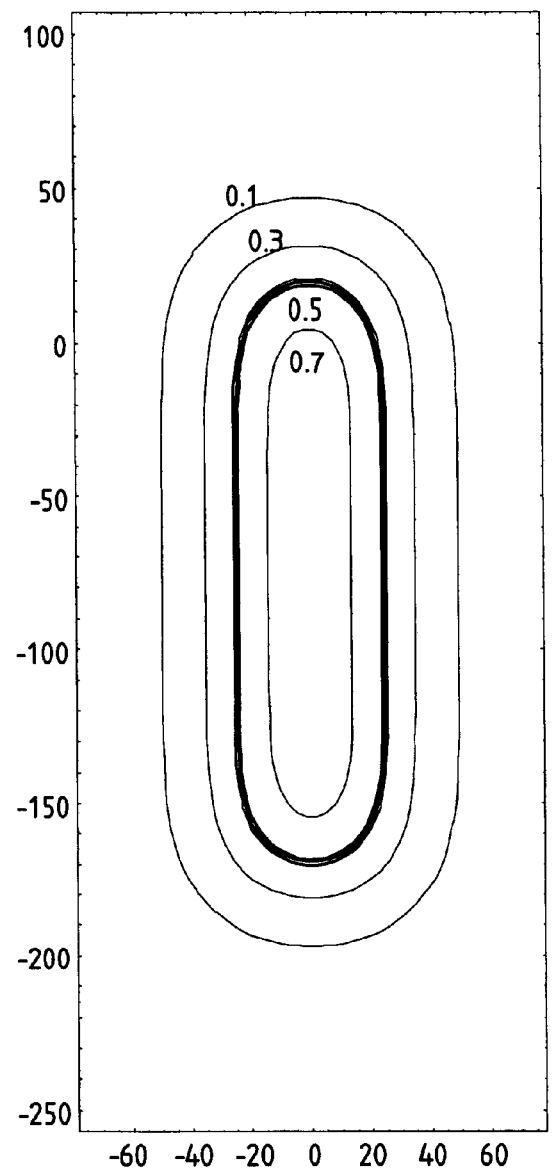
Fig. 5a
Fig. 5b

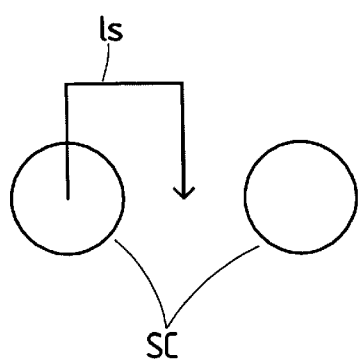
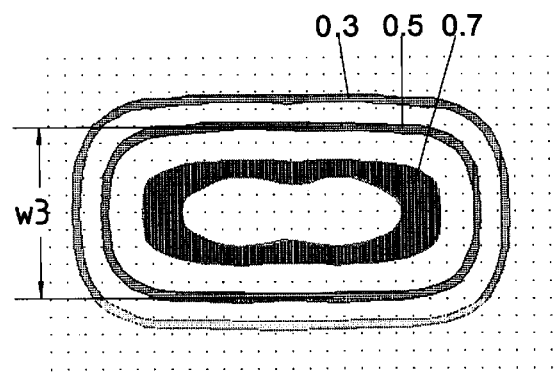
Fig. 8a                    Fig. 8b
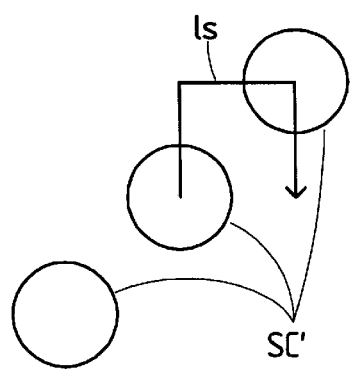
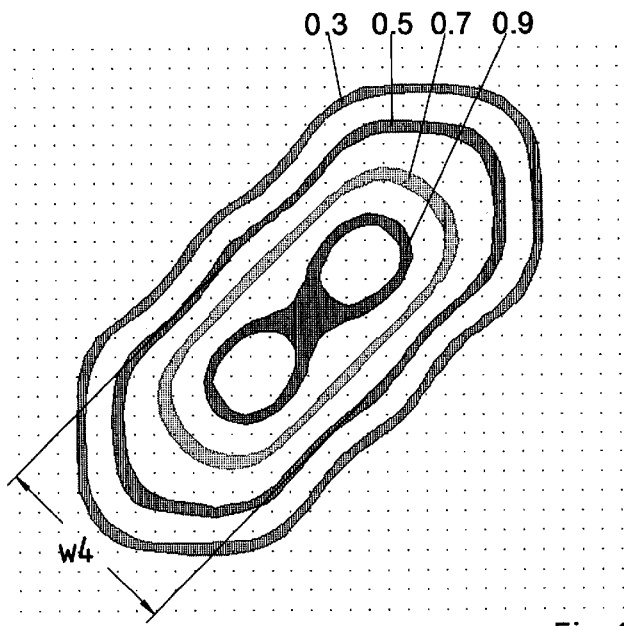
Fig. 9a                    Fig. 9b

LITHOGRAPHIC METHOD FOR PRODUCING AN EXPOSURE PATTERN ON A SUBSTRATE

FIELD OF THE INVENTION AND DESCRIPTION OF PRIOR ART

The invention relates to a lithographic method for producing an exposure pattern on a substrate comprising a layer of resist material sensitive to exposure to an energetic radiation, wherein in a pattern transfer system (e.g., a lithographic imaging system) by means of a beam of said energetic radiation a mask having a structure pattern, namely, a set of transparent structures to form a structured beam, is illuminated and the structure pattern is imaged onto the substrate by means of the structured beam, the substrate being positioned after the stencil mask as seen in the optical path of the beam, producing a pattern image, namely, a spatial distribution of irradiation over the substrate, the spatial distribution having a finite pattern transfer blur as determined by the pattern transfer system, and the pattern image is shifted laterally with respect to the substrate between a plurality of predetermined shift positions and with each shift position the substrate is irradiated for a predetermined time, the width of lateral displacements between two neighboring shift positions being smaller than the minimum feature size of the exposure pattern to be formed.

In manufacturing semiconductor devices, one important step for structuring the semiconductor substrates is lithography. The substrate, for instance a silicon wafer, is coated with a thin layer of photosensitive material, called photo-resist. By means of a lithographic imaging system, a pattern is imaged onto the photo-resist, and the subsequent development step removes from the substrate either the exposed or the unexposed portion of the photo-resist. Then, the substrate is subjected to a process step such a etching, deposition, oxidation, doping or the like, the photo-resist pattern on the substrate covering those portions of the surface that shall remain unprocessed. The photo-resist is stripped, leaving the substrate with the new structure. By repeating this sequence, multiple structure layers can be introduced to form the semiconductor micro-circuits.

Lithographic projection methods and lithographic devices using electron beams are discussed, for instance, in H. Koops, "ELECTRON BEAM PROJECTION TECHNIQUES" 235–255, FINE LINE LITHOGRAPHY (Roger Newman ed. 1980). Electrons, and in particular ions, have the advantage of very low particle wavelengths—far below the nanometer range—which allows for very good imaging properties, as, for example, discussed in Gerhard Gross et al., "Ion projection lithography: Status of the MEDEA project and United States/European cooperation," J. VAC. SCI. TECHNOL., B16(6), pp. 3150–3153, Nov./Dec. 1998.

In projection lithography, the pattern to be imaged onto the photoresist-covered substrate is produced by using a mask or recticle having the desired pattern. For particle projection systems, stencil masks are used in which the patterns to be projected are formed as apertures of appropriate shape in a thin membrane, i.e., a few micrometers thick. The mask pattern is built up from a number of apertures in a thin membrane through which the particle beam is transmitted to expose the resist-coated wafer in those areas required for device fabrication.

Stencil masks may also be used in lithography systems based on photons, like EUV (Extreme UV) or X-ray lithography, e.g. in the EUV lithography system transmission mask geometry as proposed by H. Löschner et al. in the U.S. application Ser. No. 09/316,834.

A further application of the present invention is for the stencil masks used in vapor deposition systems, e.g. in nanosieves as put forward in J. Brugger et al., "RESISTLES 100-nm PATTERN FORMATION USING NANOSIEVES AS SHADOW MASKS", INTERNATIONAL CONFERENCE ON MICRO- AND NANO-ENGINEERING ABSTRACT BOOK, Rome, Italy, 193–194, Sep. 21–23, 1999. In this case, the particles are essentially neutral atoms or molecules. In this case, the particles are essentially neutral atoms or molecules.

As also discussed by H. Koops, op. cit., pp. 245–248, with self-supporting stencil masks a problem arises for configurations which require a ring-shaped exposure region on the wafer; the central area of the ring-shaped region is completely surrounded by the aperture (so-called doughnut problem) and thus 'cut out'. Problems also arise with simply connected patterns like free-standing bars or leafs. Therefore, additional means need to be taken to stabilize the central area in the proper position of the mask. Also for large or very long aperture areas in the mask, which effectively separate the mask foil into distinct parts, a stability problem arises; moreover, these structures are difficult to prepare.

Therefore, a "crossed grating solution" was proposed for electron projecting systems, where a supporting grid of the finest grid constant which can be generated is overlaid on the desired pattern for device fabrication. If the supporting grid constant is about one tenth of the finest line-width in the mask, the supporting grid will vanish in the exposed and developed area, due to the proximity effect and the limited resolution of the projecting optical system. Due to the fine dimensions of the supporting grid, however, its production is too difficult to be practically implemented.

Another approach, presented, for example, in U Behringer and H. Engelke, "Intelligent Design Splitting in the Stencil Mask Technology Used for Electron- and Ion-Beam Lithography," J. VAC. SCI. TECHNOL. B11(6), pp. 2400–2403, Nov./Dec. 1993, splits the device pattern into complementary mask fields situated on at least two masks. Thus, the pattern on each complementary mask is more stable; however, now a set of masks has to be handled with the lithography setup. Also, the production expenses of the stencil masks are multiplied accordingly.

The so-called "multibeam" solution, also described by H. Koops, op. cit., subdivides the device pattern into squares of equal area by a software routine; for each square of the device pattern, an aperture is provided in the aperture pattern which, though, only covers a fraction, e.g., a quarter, of the device pattern square. This is illustrated in FIG. 1 with a device pattern DP having the shape of a rectangular line. The structure of the pattern is subdivided into quadratic areas PQ which each correspond to a quarter of the smallest elements in the device pattern desired. With a line as in FIG. 1, a square has a side length ps equal to half the line width dw; typical values of these dimensions are, for example, ps=100 nm and dw=200 nm. The substrate is multiply exposed with this aperture pattern, in the example of FIG. 1 four times where one square PQ is shifted laterally, as indicated by the arrow-line is, to the four quadrants of a square of doubled side length, pd=2 ps, and the total pattern is constructed by subsequent exposures of the wafer; for each shift position, the same duration of irradiation is used. Within this disclosure, a 'lateral' movement means a movement along the—usually flat—surface of the substrate or mask, as the case my be. In the pattern thus produced, the adjacent images PQ' of the aperture squares PQ lie side by side, as illustrated in FIG. 1a. It should be noted that the dimensions of the imaged pattern depend on whether the imaging optics is a 1:1 optics or has a demagnification, e.g. by a factor of 4. By virtue of the "multibeam" solution, a plurality of small apertures is realized instead of a large opening in the foil, and the remaining foil forms stable struts between the apertures which improves the mechanical stability of the mask and eases preparation of the masks.

An electron microprojector setup and mask geometries exploiting the "multibeam" method are also described in J. Frosien et al., "Application of the electron microprojector in the field of microlithography," PROCEEDINGS OF THE MICROCIRCUIT ENGINEERING '79, Rhienisch-Westfalische Technische Hochschule, Aachen, Germany, Sep. 25–27, 1979.

However, the "multibeam" solution has been rejected for the use in semiconductor lines since it appeared that only straight lines parallel to one of the directions of the lateral shift and, moreover, only structures having dimensions which are integer multiples of the distance pd between neighboring aperture openings could be obtained. Moreover, it is impossible to compose from 'orthonormal' squares as defined by the lateral shift displacements, such as those PQ' of FIG. 1a, a sufficiently smooth edge running along an inclined line—a problem very similar to the problem well known from digitalization of images into raster graphics.

SUMMARY OF THE INVENTION

It is an aim of the present invention to overcome these restrictions of the "multibeam" solution and to offer a way for a better design flexibility. In particular the invention is aimed at using a single mask for producing structure which are, within prescribed limits of geometrical accuracy, slanted with respect to the direction of the lateral movement and structures of arbitrary dimensions with a particle-beam lithography projection setup.

This aim is met by a lithographic method as stated in the beginning wherein, according to the invention, the dimension and/or direction of at least one structure of the structure pattern is incongruent with respect to the lateral shift displacements between shift positions, and the pattern transfer blur is not smaller than the width of lateral displacements between neighboring shift positions, the exposures with respect to the plurality of shift positions superposing into a spatial distribution of exposure dose on the substrate, said distribution exceeding the specific minimum exposure dose of said resist material within only one or more regions of the substrate, said region(s) forming the exposure pattern.

This solution makes it possible to produce device patterns which cover large areas or are enclosing free-standing areas without endangering the structural stability of the mask. The average void ratio of the stencil mask according to the invention is small, typically smaller than 12.5%, thus the local anisotropy of the foil properties can be kept small. Thus the invention allows of a 'self-complementary mask', by means of which the desired exposure pattern is composed from a set of images of the very same mask pattern.

The pattern transfer blur is chosen according to the desired 'smear-out' with respect to the incongruent pattern structuring of the mask actually used. In the context of this disclosure, the pattern transfer blur is defined as the width at half the maximum of the irradiation spread function, where the latter corresponds to the spatial distribution of irradiation on the substrate produced by a point-like aperture (or point-like reflective spot, as the case may be). For the sake of brevity, in the following the simple reference to the 'blur' will refer to the pattern transfer blur unless indicated otherwise. If, e.g., the irradiation spread function has a Gaussian shape, the blur is 2.36 times the standard deviation σ of the Gaussian distribution.

In a preferred embodiment of the invention, the pattern transfer blur is advantageously in the range of 1.4 to 1.8 times the width of lateral displacements between neighboring shift positions.

One method for performing the lateral displacement of the image pattern over the substrate employs adjustment of the optical properties of the pattern transfer system which usually can be adjusted with a high accuracy, in particular in the case of a particle optical system. Thus the pattern image is laterally shifted with respect to the substrate by adjustment of the optical properties of the pattern transfer system. This way of lateral shift allows a high precision of the displacement of the image pattern while the mask and the substrate can rest still during the exposure procedure.

In a preferred embodiment the energetic radiation comprises electrically charged particles, and the pattern transfer system is a particle optical imaging system. This makes it possible to realize a very low numerical aperture which leads to a high depth of focus at the image plane, which is especially advantageous if the substrate is non planar, e.g. if it is structured vertically as well. Preferably, the radiation comprises ions, such as hydrogen or helium ions, and the pattern transfer system is an ion optical imaging system. It is noteworthy that the particles used for the lithography beam can be any electrically charged species, in particular ions which are primarily used by the applicants. In comparison to electrons, ions offer even more advantageous values of optical parameters, for instance, with 10 keV protons, the wavelength is approximately 0.05 pm; a typical value of numerical aperture is $10^{-5}$, and depth of focus 500 μm. With a particle lithography system, the lateral shift of the pattern image can advantageously be performed by an electrostatic multiple means of the particle optical imaging system, as used, for instance, in the masked-beam system disclosed by Stengl et al. in the U.S. Pat. No. 5,742,062.

Another variable method for performing the lateral shift of the image pattern with respect to the substrate is by laterally shifting the substrate and/or the mask. The controlled movement of the substrate, the mask, or a combination of both allows a direct control of the displacement of the pattern image on the substrate.

Further, it is advantageous if the total area occupied by the structures in the mask—within the totality of the structure pattern formed in the mask or one or more parts of the structure pattern—is smaller than the area corresponding to the exposure pattern to be formed on the substrate divided by the number of lateral shifts. By this measure, the stability of the mask is further increased; in charged particle lithography, also the total current required to form the exposure pattern on the substrate is reduced, thus increasing the throughput of the system.

The device pattern elements to be produced usually have rectangular or polygonal shapes. Correspondingly, the pattern structures in the mask can be of rectangular shape. Rectangular pattern structure are easy to process with the software for designing the mask pattern. Alternatively, the pattern structures in the mask may be of rounded shape. Circular or other rounded structures are easier to produce with known methods of structuring. Furthermore, in particular in the case of circular structure elements, the orientation of the elements needs not to be taken into account, it should be noted in this context that, as discussed more in detail below, the details of the pattern structure shapes are of minor importance as compared to the overall layout of the structures.

The lithographic system in which the invention is realized can be a demagnifying particle projection system, such as the 4×demagnifying system as described in detail by Stengl et al. in the U.S. Pat. No. 4,985,634. FIG. 10a shows in graphical symbol form an example of a demagnifying particle system 100 for imaging an exposure pattern from a mask 103 onto a substrate WF. An ion beam source S projects the beam 101 through various components of the demagnifying particle system 100, optionally including an electrostatic multipole means 102, to produce the beam 101 shown in FIG. 10a. The system 100 may also contain various other components (not shown) known to those skilled in the art. Since the structure pattern elements of the mask for a demagnifying system have greater dimensions, production of the mask is facilitated. Moreover, the flow density of the particle beam at the mask can be reduced accordingly. Another lithography system suitable for the invention may be a 1:1 ion shadow projection system, for instance, the above-mentioned masked-beam system of Stengl et al., U.S. Pat. No. 5,742,062. FIG. 10b shows in graphical symbol form an example of a 1:1 ion shadow projection system 200 for producing an exposure pattern defined in a mask 203 on a substrate WF. A beam source S projects a beam 201 through various components of the system 200, which as discussed above, may optionally contain an electrostatic multipole means 202, along with various other components (not shown) known to those skilled in the art.

BRIEF DESCRIPTION OF THE DRAWINGS

In the following, the present invention is described in more detail with reference to the drawings, which show:

FIGS. 1 and 1a an aperture pattern for producing a straight line pattern with the known "multibeam" solution;

FIGS. 5a, 5b, and 6a, 6b two aperture patterns (FIGS. 5a and 6a) for imaging a vertical stroke according to the invention, and the respective dose distributions (FIGS. 5b and 6b), wherein the stroke of FIG. 6b is longer than that of FIG. 5b by one half of the minimum feature size;

FIGS. 8a, 8b and 9a, 9b two further aperture patterns (FIGS. 8a and 9a) having rounded aperture pattern elements, and the respective dose distributions (FIGS. 8b and 9b).

DETAILED DESCRIPTION OF THE INVENTION

As a preferred embodiment of the invention, which is discussed in the following, the production of an exposure pattern is done using the ion-beam lithography projector with a 4×magnification as described in detail by Stengl et al. in the U.S. Pat. No. 4,985,634. It is to be understood that this embodiment is not meant to restrict the invention to this special case; rather, whenever ions are referred to, the extension to other types of radiation, including e.g. electrons, X-rays or EUV, or neutral particles for vapor deposition, is understood and easily reproducible for the person skilled in the art.

Figure 1A:
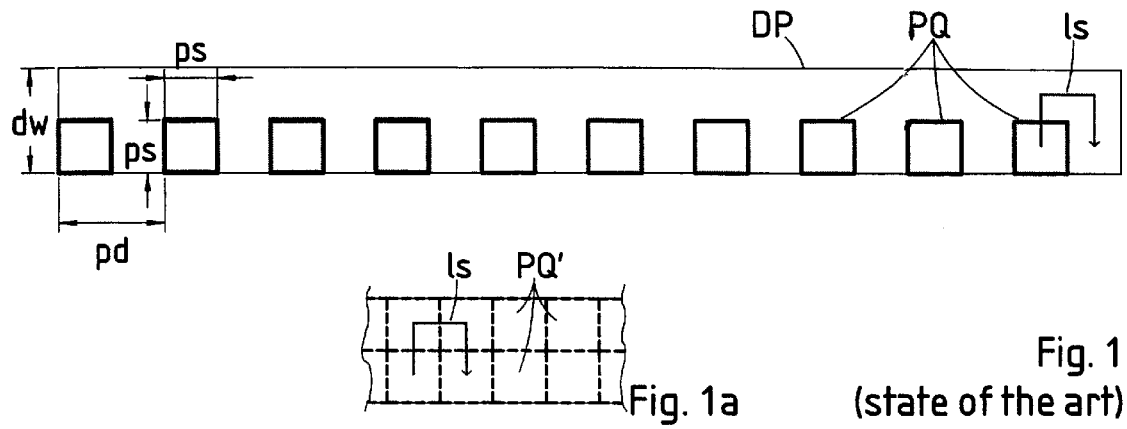
Figure 2:
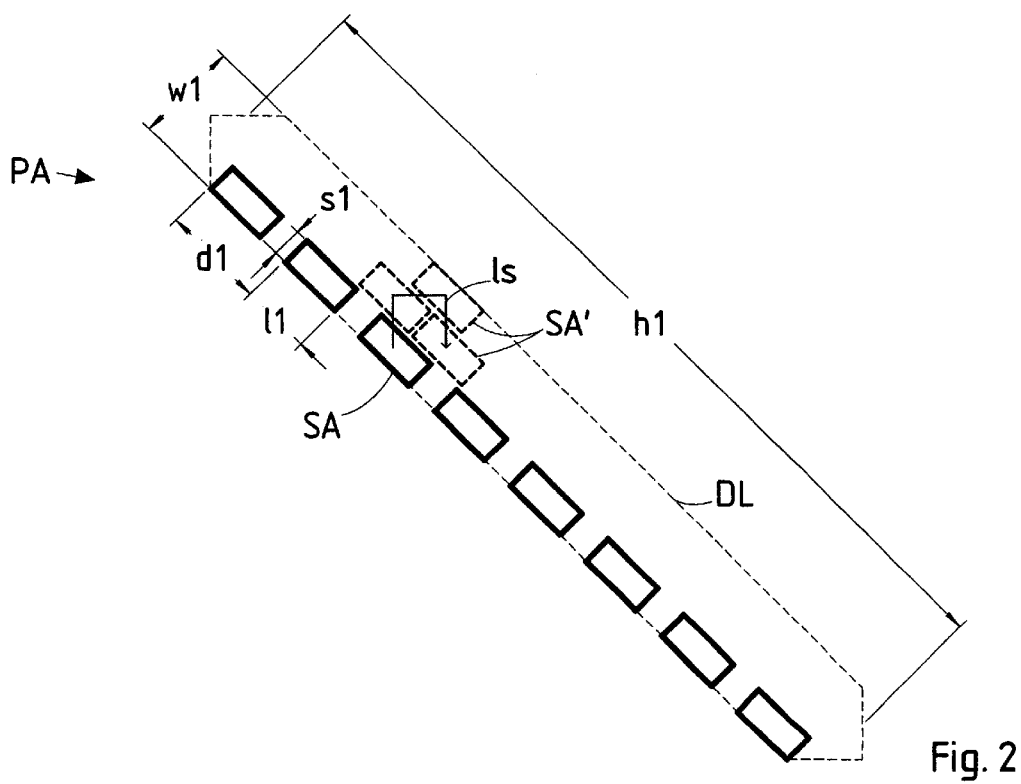
FIG. 2 an aperture pattern according to the invention for producing an exposure pattern in the shape of a line in an oblique angle.

As already explained above, the pattern image produced on the substrate is shifted laterally between different shift positions on the substrate. In the embodiments of the invention discussed below, a set of four shift positions, arranged in a square is as shown in FIGS. 1 and 2 are used. It is in principle possible to use three or more than four shift positions, or a different arrangement of four shift positions; however, this usually brings no additional advantage as compared to the four shift positions arranged in a square. On the other hand, for the square arrangement of shift positions, the displacements are very easy to control with usual equipment and the determination of the aperture pattern of the mask is straightforward. In the embodiment of the invention shown here, the minimum feature size of the device pattern on the substrate is 50 nm, corresponding to an effective feature size of 200 nm on the stencil mask by virtue of the demagnification factor 4. Consequentially, the width of the lateral shift displacements is half the effective feature size, i.e. 100 nm, if measured with respect to the mask, or half the minimum feature size, i.e. 25 nm, if measured with respect to the exposure pattern on the mask.

Figure 4:
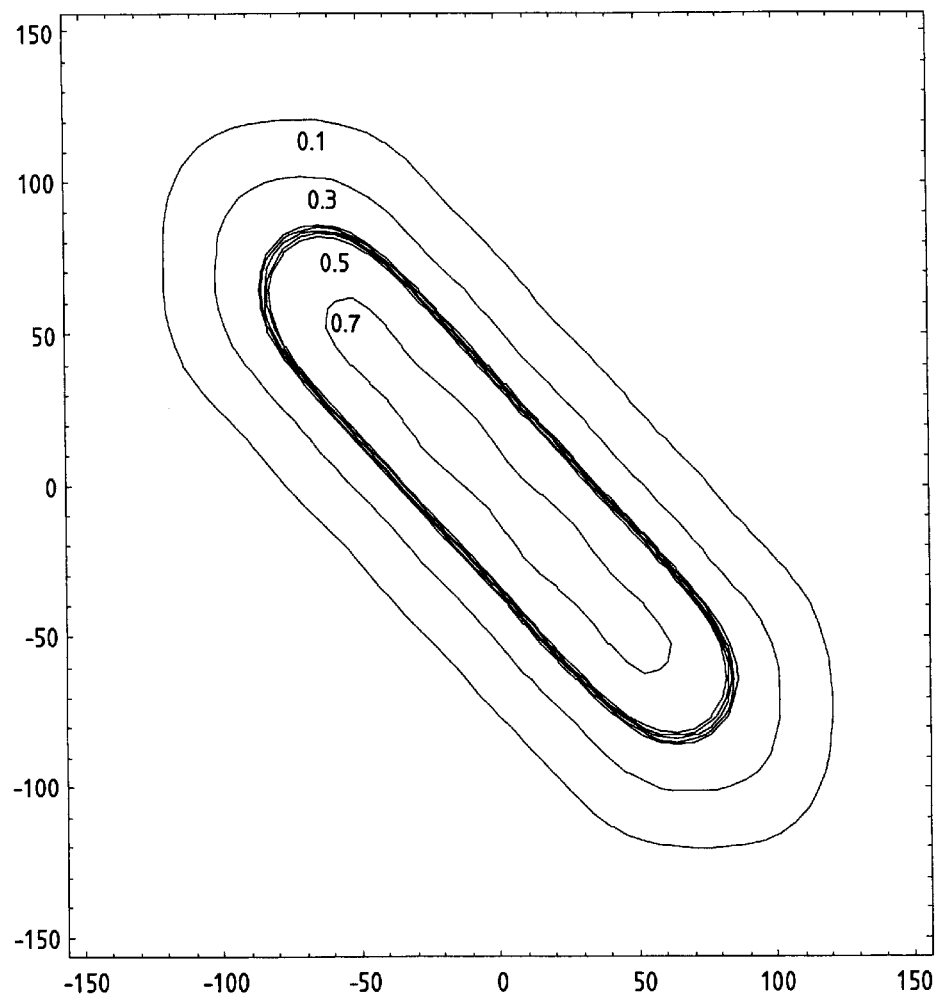
FIG. 4 the distribution of exposure dose on the substrate as produced with the aperture pattern of FIG. 2 at a blur of 1.6 times the lateral shift width, according to the invention.

FIGS. 2 and 4 demonstrate the principle of the invention with respect to an example of an exposure pattern which corresponds to the line DP of FIG. 1, however, rotated by an angle of 45°. Thus, a shown in FIG. 2, the desired exposure pattern of this example has the shape of a line running at a 45° angle with respect to the predetermined shift directions 1s; the corresponding effective pattern DL on the mask has a width w1=200 nm equally the effective feature size and a length h1 of several times its breadth w1. The dashed line D gives an outline of the desired pattern. It should be noted, however, that due to the allowed tolerances small deviations of the exposure pattern from this outline are acceptable, that is, if they are within a prescribed tolerance limit which is well below the minimum feature size of the device pattern to be produced.

The lateral shift displacements 1s, of course, remain unchanged, irrespective of the orientation of the exposure pattern desired. It would be impractical to adjust the lateral shifting since the operation of the mask station is done without regard to the structure pattern of the mask actually present, and more important, since the same stencil mask will have other pattern structures which may be oriented along a shift direction or other directions not compatible with the axis of the line pattern DL. As a consequence, since the line DL retains its width w1 which corresponds to the effective feature size of the aperture pattern, the dimensions of the line DL would be incompatible with the grid as defined by the lateral shift 1s.

An aperture pattern PA according to the invention for producing the slanted line pattern DL is shown in FIG. 2. As can be seen, the aperture pattern PA is composed of small openings SA, which preferably are of rectangular shape. The aperture pattern PA is imaged using a pattern transfer blur sufficient to level out the gaps between the individual openings SA. The offset d1 between two neighboring openings of the aperture pattern is chosen equal to the effective feature size, that is, 200 nm. In order to allow for a sufficiently smooth edge of the exposure pattern produced by means of the pattern PA, the axes of the rectangles are oriented along the line of the exposure pattern to be imaged.

The dimensions of the rectangular openings SA as displayed in FIG. 2 are s1=60 nm and l1=140 nm. The width a1 is chosen such that the openings, taking into account the positions upon dislocation by the lateral shift, cover an area whose breadth is again the line breadth w1 desired. In FIG. 2 the four positions SA' of one of the openings SA upon being laterally shifted are depicted as rectangles with dashed lines; as can be seen, they fill the breadth of the line DL. The length l1 of the openings SA is chosen so as to compensate for the reduced width as compared to an 'orthonormal' square PQ in order to retain the net area of the aperture and provide the desired amount of dose irradiation on the substrate with respect to the required exposure dose of the resist material.

Since the openings SA forming the structure pattern PA are incongruent with respect to the lateral shift displacements 1s, the superposition of the aperture pattern PA according to the plurality of shift positions does not cover the whole area of the prospective line pattern DL in a uniform manner. Rather, depending on the geometry of the openings SA and the shift movements 1s, some regions may be left free and other regions may be doubly or even multiply covered. In FIG. 2, the struts between the openings SA are left free while in the center area of the line DL there are doubly covered areas.

The resolution properties of the pattern transfer system determine the blur of the lithography system. According to the invention, the blur must not depend on the geometry and size of the pattern elements, e.g. it should not be due to diffractive effects in the mask pattern structures.

In particle lithography systems, due to the short wavelength of the particles, diffractive effects play a minor role for the resolution quality. Rather, the blur is determined by lens aberrations, in charged particle optics also by stochastic Coulomb interactions. In case the blur is not sufficient for the use with the invention, additional blur can be introduced by adapting the pattern transfer system suitably.

In X-ray or EUV lithography, where the resolution limiting blur is mainly determined by diffraction, additional blur must be introduced according to the invention. One possibility is to dynamically produce additional blur. During the exposure procedure, the position of the pattern image is wobbled laterally within an area having a size corresponding to the blur desired. The dynamic wobbling can be done by one of the methods proposed above for the lateral shift displacement of the image pattern over the substrate, that is, lateral movement of the mask, lateral movement of the substrate, or a combination of these. Preferably, the wobbling is done using the same method as with the shift displacements; however, the wobbling and the shift can be done by different means. For instance, the substrate may be wobbled to produce the desired blur whereas the mask is shifted laterally between shift positions during the exposure procedure.

Figure 3:
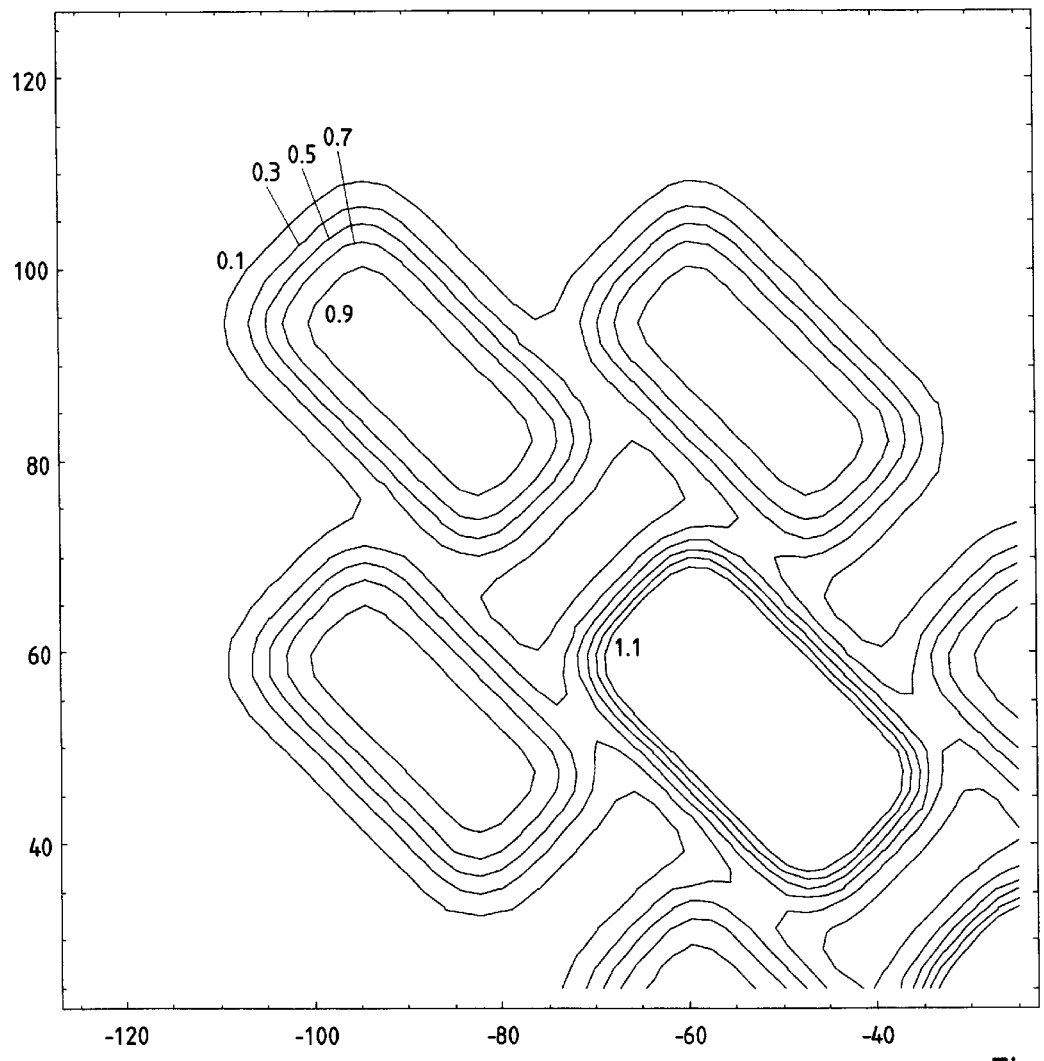
FIG. 3 the distribution of exposure dose on the substrate as produced with the aperture pattern of FIG. 2 at a small pattern transfer blur.

FIG. 3 shows the distribution of the exposure dose over the substrate plane which would be produced after irradiation, with a blur of only 7 nm, of the substrate using the aperture pattern of FIG. 2 with the denoted set of four shift positions. It is clear from FIG. 3 that due to the low blur of 7 nm, the images of the individual pattern openings SA, SA' are distinctly visible. For the sake of better visibility of the details, FIG. 3 gives only the upper-left end of the spatial distribution in an enlarged view; the dimensions on the vertical and horizontal axes are given in nm. Since the lithography system has a demagnification of factor 4, the dimensions of the image pattern of FIG. 3 are reduced accordingly with respect to the dimensions as given in FIG. 2. The lines shown in FIG. 3 connect points of equal exposure dose (measured, e.g., in units of $\mu C/cm^2$); the lines correspond to 0.1, 0.3, 0.5, 0.7, 0.9 and 1.1, respectively, times the "full" exposure dose, that is, the exposure dose which would be obtained in the center of a large exposed area after the exposure with a single shift position. Exposure doses above the "full" exposure dose are possible where regions are doubly covered by irradiation in different shift positions.

According to the invention, an exposure dose distribution which covers the whole desired device pattern can be obtained using a blur chosen higher than the shift distance between neighboring shift positions. Exposure patterns reproducing the desired patterns well within the prescribed geometrical accuracy can be obtained using a blur within the range of 1.4 to 1.8 times the shift width of the lateral shift, corresponding to 0.7 to 0.9 times the minimum feature size of the substrate. FIG. 4 shows the spatial distribution of exposure dose obtained at a blur of 1.6 times the shift width (0.8 times the minimum feature size), i.e. 40 nm, upon exposure with the aperture pattern of FIG. 2 and exposure for the same irradiation duration with each of the four shift positions as denoted by the arrow-line 1s. The lines correspond to 0.1, 0.3, 0.5 and 0.7, respectively, of the "full" exposure dose. The 0.5-line is drawn as a strong line; it is used as the contour line for the exposure pattern. The radiation intensity of the ion beam and/or the irradiation duration of the irradiation in each shift position is chosen so that the exposure dose obtained at the 0.5-contour line corresponds to the specific minimum exposure dose of the resist material. As can be seen from FIG. 4, the line as defined 0.5-contour has the desired width, namely the minimum feature size of 50 nm.

As illustrated by the FIGS. 2 to 4, by means of the method according to the invention an exposure pattern having slanted or even curved contour lines can be produced with a single, self-complementary stencil mask even though the direction of the contour is incongruent with the displacement vectors of the lateral shift movement during exposure.

Figure 6A:
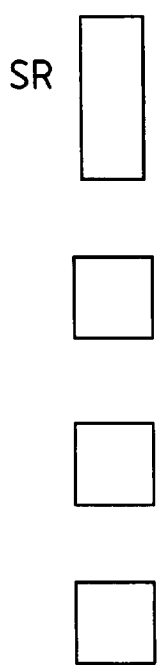
Figure 6B:
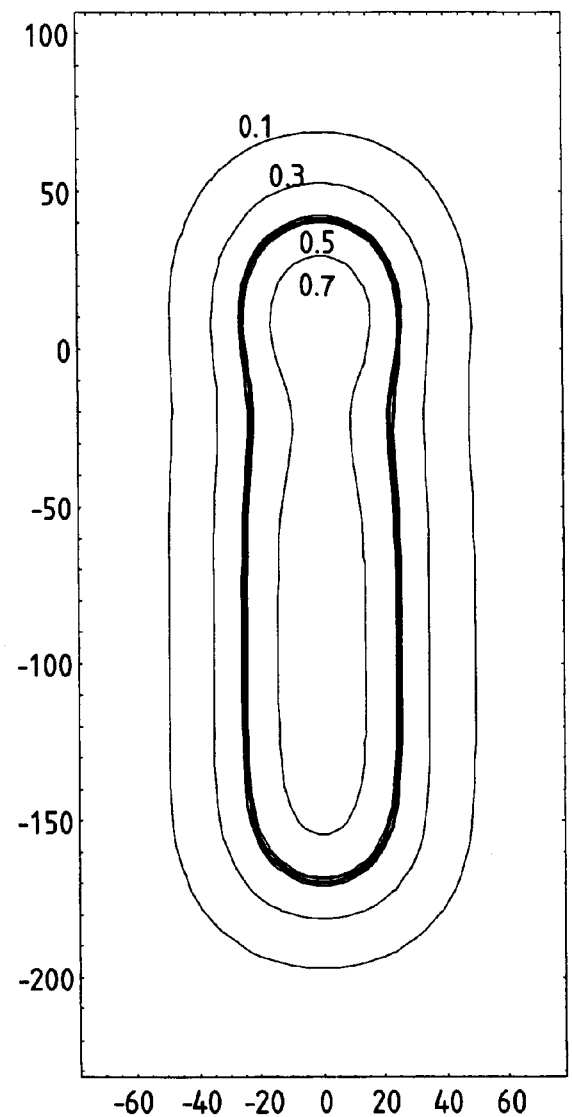

FIGS. 5 and 6 give two further examples of exposure patterns produced accordingly to the invention. For the sake of better clarity, the scale of FIGS. 5a and 6a is 4 times reduced with respect to that of FIGS. 5b and 6b so as to give a better understanding of the relationship between the aperture patterns and the resulting exposure distributions. The imaging of the aperture patterns into exposure patterns is done as discussed with FIGS. 2 and 4.

FIG. 5a shows an aperture pattern consisting of four square openings arranged in a line; the side of a square is 100 nm. FIG. 5b shows the exposure pattern which is produced by imaging the aperture pattern of FIG. 5a; the lines have the same meaning as in FIG. 4. Again, the 0.5-contour gives the contour of the exposure pattern and produces a pattern line having a width of 50 nm.

FIG. 6 gives an example for the production of a length that is not an integer multiple of the minimum feature size. In the aperture pattern shown in FIG. 6a, the topmost square is substituted by a rectangle SR whose length is about the double of a square's side. Consequently, the resulting exposure pattern, shown in FIG. 6b, is longer than that of FIG. 5b by one half of the minimum feature size. The width of the rectangle SR is reduced by about a quarter of the original side width in order to suppress a broadening of the contour.

Figure 7:
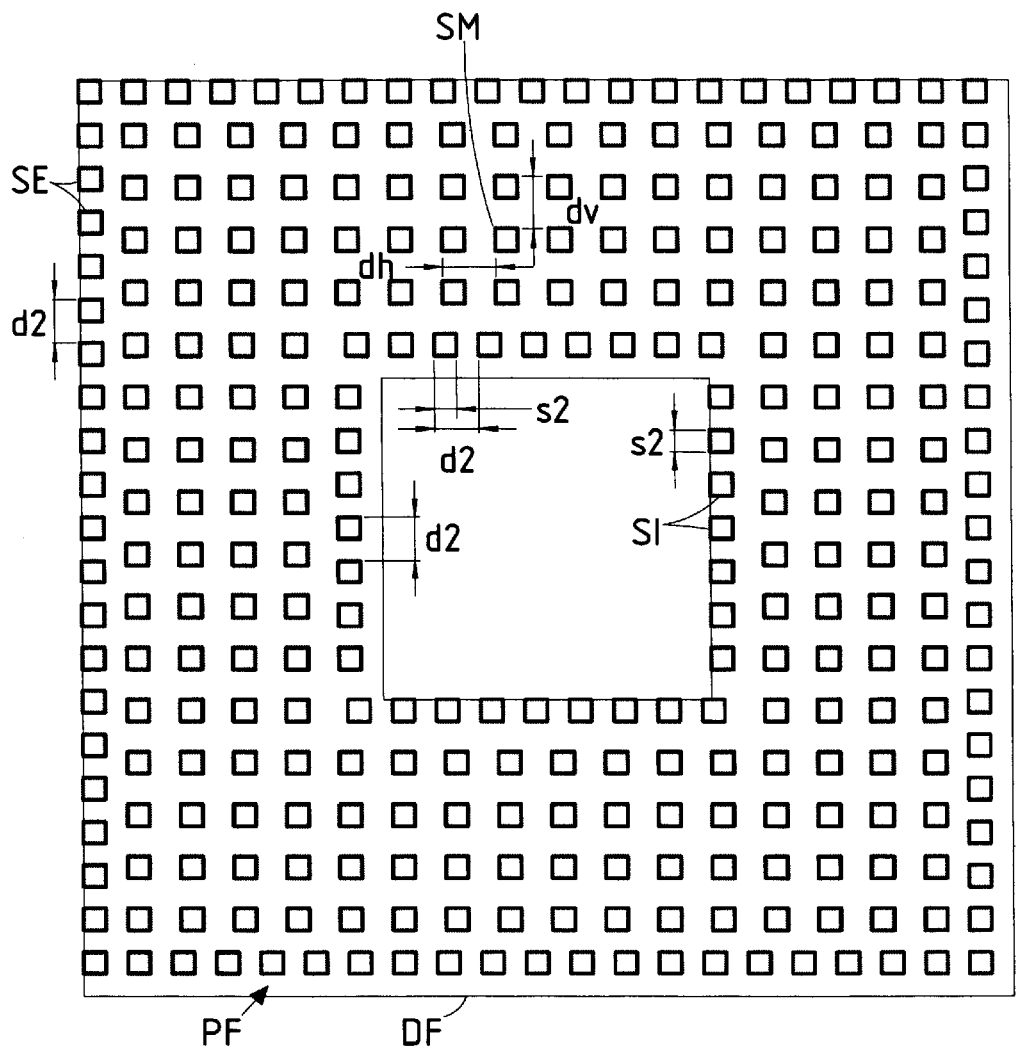
FIG. 7 a fourth aperture pattern for producing a square-shaped exposure pattern with a central square window.
Figure 10A:
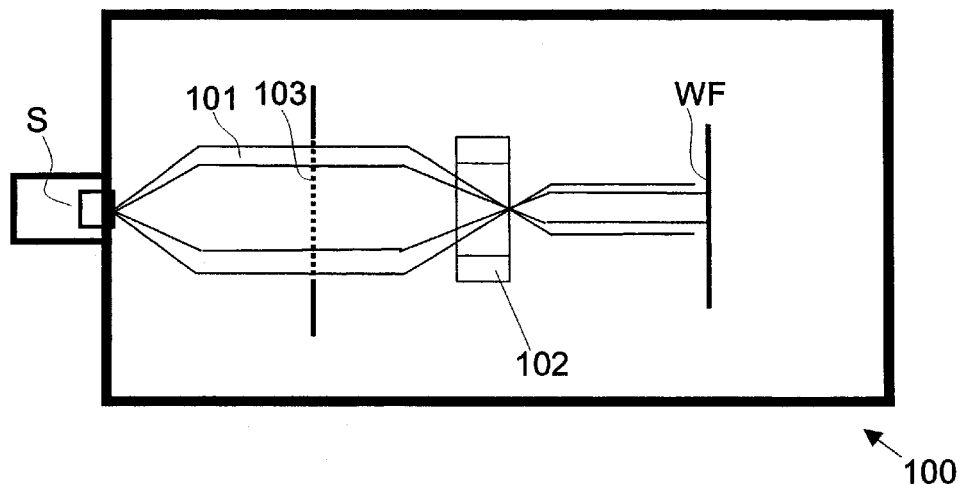
FIG. 10a is a longitudinal cross-section of a demagnifying particle system with an electrostatic multipole means shown in graphical symbol form.
Figure 10B:
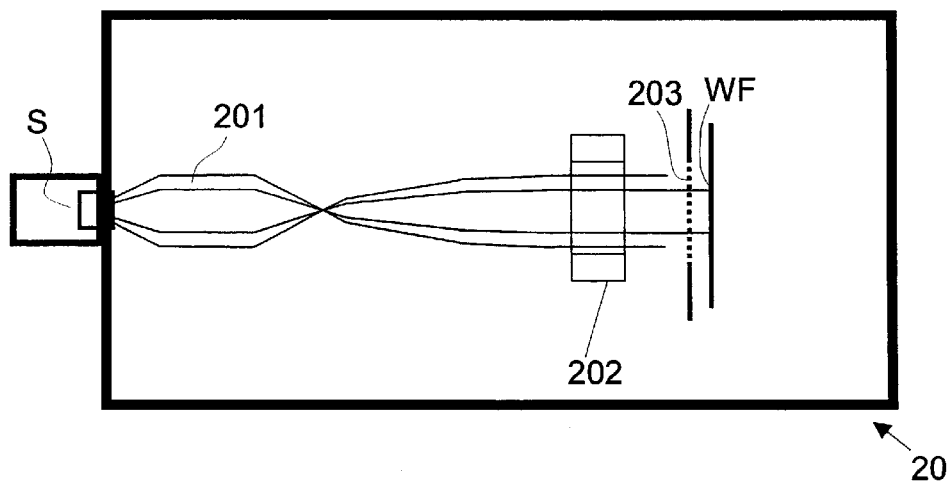
FIG. 10b is a longitudinal cross-section of a 1:1 ion shadow projection system with an electrostatic multipole means shown in graphical symbol form.

FIG. 7 shows another aperture pattern PF for producing a square-shaped exposure pattern with a central square window; the resulting exposure pattern DF is denoted by the outer and the inner square drawn using thin lines. The aperture pattern PF used for producing this exposure pattern DF comprises a plurality of square-shaped aperture openings SE, SM, SI which all have the same side width s2. The side width of the openings is suitably chosen equal to half the minimum feature size, i.e., 100 nm. Furthermore, the distance between neighboring apertures in the middle of the device pattern can be wider than along the surrounding contour. This results from the fact that a point on the substrate lying well within the exposure pattern area receives contributions of irradiated dose from a larger set of aperture openings as compared with a point near to a contour of the pattern. As a consequence, in the pattern of FIG. 7 the aperture SE positioned at the outer edge of the square as well as those SI at the lining of the central window are set apart by an offset d2 equal to the minimum feature size, i.e. 200 nm, while within the area of the pattern, the spacing between the individual apertures SM can be wider. Thus the total area occupied by the structures in the mask is smaller than the area corresponding to the exposure pattern to be formed on the substrate divided by the number of lateral shifts. The enlarged spacing between the pattern apertures further enhances the mechanical stability of the foil within the area of the pattern. Moreover, the reduction of the total aperture area allows to lower the particle flow in the system which helps reducing the stochastic blur. In the example of FIG. 7, the vertical offset dv and the horizontal offset dh are both chosen 240 nm (isotropic spacing). In other geometries, the spacing can be anisotropic, depending on the shape of the pattern and the inner stress configuration of the foil which is also determined by surrounding patterns.

The masks, as discussed here, can be produced by well-known methods as, for example, described in J. Butschke et al., "PN AND SOI WAFER FLOW PROCESS FOR STENCIL MASK FABRICATION," MASK TECHNOLOGY FOR INTEGRATED CIRCUITS AND MICRO-COMPONENTS '98, LECTURES HELD AT THE GMM CONFERENCE, Munich, Germany, pp. 29–38, Nov. 16–17, 1998. The stencil masks used with the invention differ from known masks only in that the dimensions of the mask structures are smaller, typically by a factor of 2, which is well within the potential of known methods. It should be noted that due to the fact that the aperture pattern consists largely of elements of equal shape, production by variable shaped e-beam writer systems is facilitated. Moreover, only a fraction of the original pattern area—here, one quarter—has to be written.

The shape of the individual stencil pattern openings SA, SR, SE, SM, SI is square or rectangular in the above-discussed embodiments. It may, however, prove to be easier to use shapes whose edges are rounded, or even circular or oval apertures, depending on the method of production for the stencil mask apertures. Since according to the invention the blur is relatively large as compared to the line width, the shape of the dose distribution will not be affected substantially by such a variation of the shape; rather, it is clear from the above discussion, and can also been seen from FIGS. 8 and 9 discussed below that using the method according to the invention, a circular aperture and a square-shaped aperture will produce exposure patterns which are, albeit not identical, nevertheless so similar that they can be regarded as equivalent with respect to the tolerances used in semiconductor production.

FIGS. 8 and 9 display examples of exposure patterns obtained using aperture patterns composed of circular openings SC, SC'. FIGS. 8a and 9a show the aperture patterns where again the scale is 4 times reduced with respect to that of FIGS. 8b and 9b showing the resulting exposure distributions. The imaging of the aperture patterns into exposure patterns is done as discussed with FIGS. 2 and 4. The lateral movements 1s are denoted by an arrow line in FIG. 8a as well as in FIG. 9a; here, the shift distance between two neighboring shift positions is 0.6 times the minimum feature size.

FIG. 8a shows an aperture pattern comprising two circular openings SC having a radius of 0.6 times the effective feature size. The openings SC are spaced apart along one of the main directions of the shift displacement by an offset corresponding to a doubled shift distance, FIG. 8b shows the exposure pattern which is produced by imaging the aperture pattern of FIG. 5a. The shaded contours correspond to the lines of FIG. 4, i.e., 0.3, 0.5 and 0.7, respectively, of the "full" exposure dose; the width of the contours displays the area covering the range of 0.025 above and below the nominal value (e.g., 0.5±0.025). The 0.5-contour gives the contour of the exposure pattern and produces a pattern line having a width w3 equal to the desired minimum feature size.

The aperture pattern of FIG. 9a comprises three circular openings SC' set along a diagonal line. The radius of the openings SC' is 0.54 times the effective features size. FIG. 9b shows the resulting exposure pattern, whose 0.5-contour takes the shape of a diagonal line within the allowable accuracy. The width w4 of the 0.5-contour again reproduces the desired minimum feature size.

The lateral shift displacements of the pattern image can be done, for example, by lateral displacement of the stencil mask, while the substrate is kept fixed. Another possibility is to move the substrate under the fixed mask. Preferably, however, both the substrate and the mask are not moved during the illumination of a set of shift positions, and the movement of the pattern image is performed by adjustment of the optical properties of the ion-optical system. In particular, the shifting of the pattern image can be performed by means of an electronic image placement system as described in the U.S. Pat. No. 5,742,062. This system originally serves as a means to compensate for misalignment of the image placement on the substrate, but it is easy to see that it can provide the lateral displacements for the 'self-complementary mask' solution according to the invention as well. This method offers the advantage of a very high accuracy and speed of positioning of the pattern image with respect to the substrate.

Since the reference marks used for detecting the image placement are usually greater than the width of lateral shift displacement, the various shift positions can be detected within one set of reference marks. The effect of the lateral shift is then corrected within the reference system by means of a correcting signal superimposed to the usual lateral adjustment signal of the reference signal, where the correcting signal directly represents the distance of the lateral shift from the zero shift position. In other systems of alignment of the image placement, a plurality of reference mark sets may be used, wherein, for instance, each set of reference marks corresponds to a shift position.

The invention facilitates the imaging of device patterns, e.g. of semiconductor devices, even if they cover large areas or are enclosing free-standing areas, such as a ring-shape, a leaf-shape or a cantilever, using a single 'self-complementary mask' without endangering the structural stability of the mask. In the stencil mask, these structures are realized as arrays of aperture openings, as can be seen in FIG. 7. Since usually not more than half of the substrate area is to be exposed, and the aperture openings in the mask occupy ¼ of the corresponding foil area or less, the average void ratio of the stencil mask is small, namely 50% /4=12.5% or less. Therefore, the foil rigidity, the thermal emissivity of the mask as well as other foil properties vary only within a small range over the mask. The fact that only small, regular aperture openings are present in the make further enhances the mask stability. Since the dimensions of the aperture openings are well below the wavelength of thermal radiation there are no thermal radiation interference effects to be expected which helps radiation cooling of the mask.

Moreover, the procedure of calculating a suitable aperture pattern according to the invention is distinctly easier than with the method of complementary masks. In most cases to determine an aperture pattern the superposition with a rectangular array of pattern openings, potentially with a subsequent step of rearranging along the pattern contours is sufficient. After production of the mask, inspection is simplified since the structures of the stencil mask are of similar shape.

What is claimed is:

1. A lithographic method for producing an exposure pattern on a substrate comprising a layer of resist material sensitive to exposure to an energetic radiation, the method comprising:

in a pattern transfer system, irradiating the substrate with a pattern image at an initial shift position for a predetermined time by illuminating a mask having a structure pattern formed from a set of transparent structures, the illuminating thereby forming a structure beam for imaging the structure pattern onto the substrate so as to produce a pattern image via a spatial distribution of irradiation on the substrate, the spatial distribution having a finite pattern transfer blur determined by the pattern transfer system;

shifting the pattern image on the substrate by a lateral displacement to a second shift position different from the initial shift position;

irradiating the substrate with the pattern image at the second shift position for a predetermined time; and repeating the shifting of the pattern image and the irradiating of the substrate for at least a third shift position different from the initial shift position and the second shift position, wherein the irradiating at the respective shift positions produces superposing exposures on the substrate so as to form a spatial distribution of exposure dose on the substrate, the spatial distribution exceeding a minimum exposure dose of the resist material within at least one region of the substrate, the at least one region forming the exposure pattern on the substrate, and wherein the width of each lateral displacement is not greater than the pattern transfer blur.

2. The method of claim 1, wherein the pattern transfer blur ranges from approximately 1.4 to approximately 1.8 times the width of each lateral displacement.

3. The method of claim 1, wherein the energetic radiation includes ions chosen from hydrogen ions and helium ions.

4. The method of claim 1, wherein the shifting of the pattern image and the substrate relative to each other occurs via an electrostatic multipole means of a particle optical imaging system.

5. The method of claim 1, wherein the shifting of the pattern image and the substrate relative to each other comprises laterally shifting one of the substrate and the mask.

6. The method of claim 1, wherein the irradiating of the substrate with the pattern image at the respective shift positions comprises illuminating a mask having a structure pattern formed from a set of transparent structures having rectangular shapes.

7. The method of claim 1, wherein the irradiating of the substrate with the pattern image at the respective shift positions comprises illuminating a mask having a structure pattern formed from a set of transparent structures having rounded shapes.

8. The method of claim 1, wherein the pattern transfer system is a demagnifying particle projection system.

9. The method of claim 1, wherein the pattern transfer system is a 1:1 ion shadow projection system.

10. A method of claim 1, wherein the width of each lateral displacement is smaller than a minimum feature size of the exposure pattern to be formed on the substrate.

11. The method of claim 1, wherein an offset between at least two neighboring structures of the structure pattern does not correspond to an integer multiple of at least one dimension of the neighboring structures.

12. The method of claim 1, wherein the width of the lateral displacements between consecutive shift positions and an offset between at least two neighboring structures are not integer multiples of each other.

13. The method of claim 1, wherein the width of the lateral displacements between consecutive shift positions and at least one dimension of at least one structure of the structure pattern are not integer multiples of each other.

* * * * *

UNITED STATES PATENT AND TRADEMARK OFFICE
CERTIFICATE OF CORRECTION

PATENT NO.    : 6,472,673 B1
DATED         : October 29, 2002
INVENTOR(S)   : Alfred Chalupka et al.

It is certified that error appears in the above-identified patent and that said Letters Patent is hereby corrected as shown below:

Column 11,
Line 33, replace "structure beam" with -- structured beam --; and

Column 12,
Line 34, replace "A method" with -- The method --.

Signed and Sealed this

Twenty-eighth Day of January, 2003

JAMES E. ROGAN
*Director of the United States Patent and Trademark Office*